(12) United States Patent
Osman et al.

(10) Patent No.: US 7,408,404 B2
(45) Date of Patent: Aug. 5, 2008

(54) PRESERVING LINEARITY OF AN ISOLATOR-FREE POWER AMPLIFIER BY DYNAMICALLY SWITCHING ACTIVE DEVICES

(75) Inventors: Saleh Osman, Norwood, MA (US); Richard F. Keenan, Whitinsville, MA (US); Jaroslaw Lucek, Cumberland, RI (US)

(73) Assignee: NXP B.V., Eindhoven (NL)

( * ) Notice: Subject to any disclaimer, the term of this patent is extended or adjusted under 35 U.S.C. 154(b) by 127 days.

(21) Appl. No.: 10/538,624

(22) PCT Filed: Dec. 10, 2003
(Under 37 CFR 1.47)

(86) PCT No.: PCT/IB03/05881

§ 371 (c)(1),
(2), (4) Date: Feb. 9, 2006

(87) PCT Pub. No.: WO2004/054095

PCT Pub. Date: Jun. 24, 2004

(65) Prior Publication Data

US 2007/0132510 A1    Jun. 14, 2007

Related U.S. Application Data

(60) Provisional application No. 60/432,896, filed on Dec. 12, 2002.

(51) Int. Cl.
*H03F 1/14* (2006.01)

(52) U.S. Cl. .......................... 330/51; 330/295
(58) Field of Classification Search ................ 330/51, 330/295, 133, 207 P, 298
See application file for complete search history.

(56) References Cited

U.S. PATENT DOCUMENTS

| | | | |
|---|---|---|---|
| 5,423,082 A | 6/1995 | Cygan | |
| 5,442,322 A | 8/1995 | Kornfeld | |
| 5,712,593 A | 1/1998 | Buer | |
| 6,064,266 A | 5/2000 | Anderson | |
| 6,362,690 B1 * | 3/2002 | Tichauer | 330/298 |
| 6,556,815 B1 * | 4/2003 | Shibamura | 455/126 |
| 6,791,407 B2 * | 9/2004 | Grebennikov et al. | 330/133 |
| 7,157,966 B2 * | 1/2007 | Baree et al. | 330/133 |

* cited by examiner

*Primary Examiner*—Robert Pascal
*Assistant Examiner*—Hieu P Nguyen

(57) ABSTRACT

An amplifier circuit (100) includes a driver stage (120) with active devices (140) for pre-amplification and output of a pre-amplified signal; and an output stage (160) with active devices (180) for further amplification of the pre-amplified signal and output of an amplified signal. A detector (190) measures levels of forward and reflected parts of the amplified signal, and a control circuit (145) independently and selectively controls turning on and off of the active devices (140, 180) of the driver and output stages (120, 160) as a function of the levels of the forward and reflected signals to substantially maintain linearity of the amplifier circuit (100) with load variations.

20 Claims, 3 Drawing Sheets

PRESERVING LINEARITY OF AN ISOLATOR-FREE POWER AMPLIFIER BY DYNAMICALLY SWITCHING ACTIVE DEVICES

CROSS REFERENCE TO RELATED APPLICATION

This application claims the benefit of U.S. provisional application serial no. 60/432,896 filed Dec. 12, 2002, which is incorporated herein by reference.

The invention relates to an isolator-free power amplifier circuit typically used in wireless communication devices which preserves linearity of the power amplifier under varying loads. More particularly, linearity is preserved by dynamically adjusting and switching of active devices of the power amplifier circuit.

Power amplifiers are used in transmitters to amplify signals, such as radio frequency (RF) signals. Such power amplifiers are included in transmitters of wireless communication devices, such as mobile telephones. The power amplifier typically provides an amplified RF signal to an antenna for transmission over the air.

RF antennas as for instance applied in mobile phones, operate in strongly varying environments, resulting in a varying antenna input impedance, a VSWR (Voltage Standing Wave Ratio) of 4:1 is not uncommon. Especially at high output levels, this may result in a severe distortion of for instance a CDMA (code division multiple access), TDMA (time division multiple access), Edge or W-CDMA modulated carrier signal having a non-constant envelope.

The conventional solution to protect the power amplifier of a cellular phone against antenna mismatch conditions to preserve linearity is to use an isolator, such as a circulator, placed between the power amplifier and the output load, such as the antenna, to limit the effects of load impedance variation on the performance of the power amplifier. The circulator secures proper 50 Ohm loading of the power amplifier under antenna mismatch conditions by dissipating the reflected power in the isolator or in a third circulator port termination. Directivity in the power flow is created by ferromagnetic material.

The above aspects of the state of the art are described in more detail with reference to FIG. 1 which shows a basic block diagram of an arrangement 10 used for a power source 12 isolated with a circulator 14 from a mismatched antenna 16. A current source 18 and its impedance $Z_0$ represent an ideal power source (RF-transistor) 12. A matching circuit 20 is connected between the antenna 16 and power source 12, with another terminal 22 connected to ground.

Part of the power $P_{inc\_circ}$ from the matching circuit 20 to the circulator 14 is delivered as $P_{inc\_ant}$ to the antenna 16 where some power is reflected back $P_{refl\_ant}$ to the circulator 14. Thanks to the circulator 14, the reflected power $P_{refl\_ant}$ from the antenna 16 is not reflected towards the source 12, but dissipated into the circulator load $P_{diss}$. Consequently, the reflected power $P_{refl\_circ}$ from the circulator 14 and the reflected power $P_{refl\_source}$ from the matching circuit 20 towards the source 12 are zero. This avoids extremes that would occur when incident and reflected waves add up in-phase. However, since it is desired to preserve power amplifier linearity and maintain Prad constant (under control of field strength indication at the base station), then the incident power $P_{inc\_source}$ from the source 12 has to be increased, thus increasing power dissipation, to overcome reflection losses resulting in enhanced signal voltage and current at the source 12. Thus, the circulator 14 only partly preserves power amplifier linearity under antenna mismatch conditions. In addition, power dissipation and consumption remains high thus requiring battery charging and decreasing battery life of the mobile phone as well as decreasing efficiency.

It is desirable to remove the isolator or circulator 14 connected to the antenna 16. However, removal of the isolator allows load impedance variations to detrimentally affect the performance, e.g., linearity, of the power amplifier. Accordingly, there is a need to have a power amplifier circuit where the isolator is removed yet the performance and linearity of the amplifier is preserved despite load impedance variations.

According to the invention, linear power output of a power amplifier is substantially maintained despite load variations and having no isolator connected to the load. This is achieved by switching, such as selectively and independently switching, in or out active devices as a function of the difference between the forward and reflected power.

In one embodiment according to the present invention, an amplifier circuit for preserving linearity of an amplifier is provided. The amplifier circuit may be used in wireless communication devices, for example. The amplifier circuit includes a driver stage having a first set of active devices which receive a signal for pre-amplification and output a pre-amplified signal. An output stage has a second set of active devices which receive the pre-amplified signal for further amplification and output an amplified signal. A detector measures levels of forward signal and reflected signal of the amplified signal. The amplifier circuit also includes a control circuit which controls turning on and off or switching the first and/or second set of active devices as a function of the levels of forward and reflected signals to substantially maintain linearity of the amplifier circuit with load variations. For example, the control circuit selectively and independently turns on and off each of the active devices included in the first and second set of active devices.

In another embodiment according to the present invention, a method for substantially preserving linearity of an amplifier under varying loads is provided. The method includes measuring levels of forward and reflected signals at the amplifier output; and selectively and independently turning on and off a first set of active devices of a driver stage and/or a second set of active devices of an output stage of the amplifier circuit as a function of the measured levels, such as the difference or ratio of the measured forward and reflected signals, to substantially maintain linearity of the amplifier circuit with load variations. For example, the turning on/off act selectively and independently turns on and off each of the active devices of the first and/or second set of active devices.

Further features and advantages of the invention will become more readily apparent from a consideration of the following description.

The accompanying drawings specify and show preferred embodiments of the invention, wherein like elements are designated by identical references throughout the drawings; and in which.

The invention, together with attendant advantages, will be best understood by reference to the following detailed description of the preferred embodiment of the invention, taken in conjunction with the accompanying drawing.

An amplifier circuit for use in wireless communication devices for example is described where, illustratively, an RF power amplifier is used in RF antenna circuits. In the following description, numerous specific details are set forth, such as specific type and number of transistors, in order to provide a thorough understanding of the present invention. However, it will be obvious to one skilled in the art that the present invention may be practiced without these specific details. In other instances, well known circuits have not been set forth in detail in order to not unnecessarily obscure the present invention.

Figure 1:
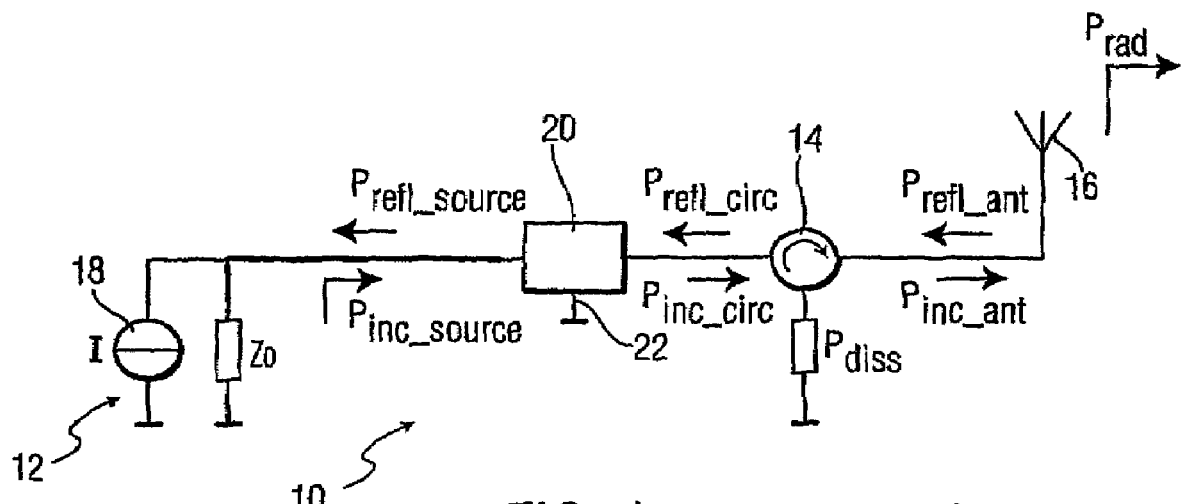
FIG. 1 shows a prior art block diagram of a power source isolated with a circulator from a mismatched antenna.
Figure 2:
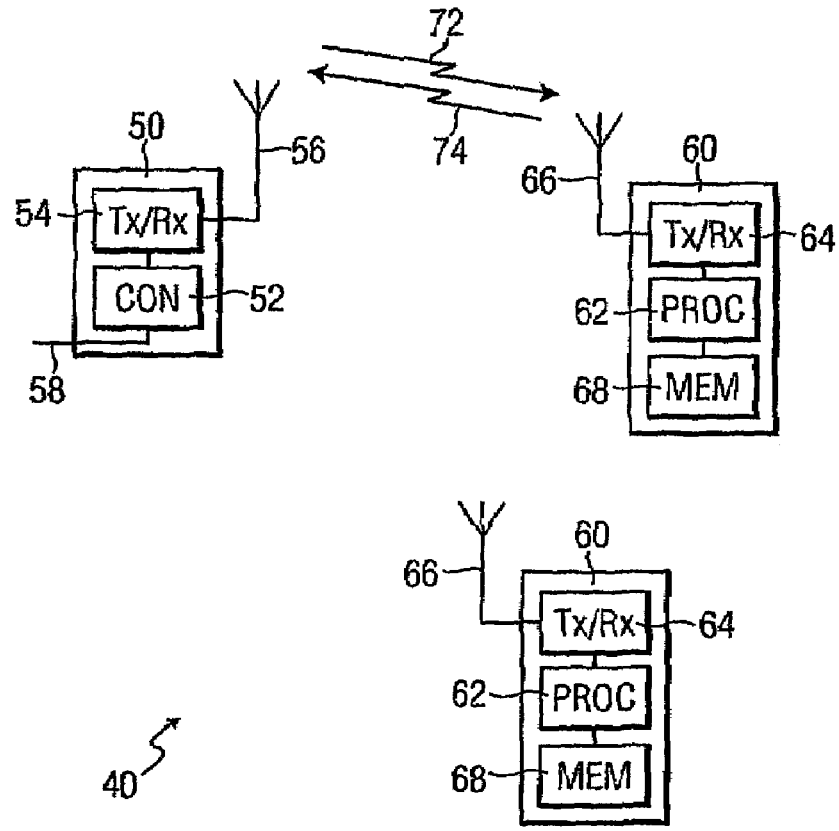
FIG. 2 shows a wireless communication system according to the present invention.

The wireless communication device may be for example a mobile cellular or cordless telephone, pager, an Internet appliance or other consumer devices, and is typically part of a communication system. FIG. 2 shows a wireless communication system, such as a mobile telephone system 40 comprising a primary or base station (BS) 50 and a plurality of secondary or mobile stations (MS) 60. The BS 50 comprises a network controller 52, such as a computer, coupled to a transceiver 54 which is in turn coupled to radio transmission means such as an antenna 56. A connection means such as a wire 58 couples the controller 52 to a public or a private network.

Each MS 60 comprises a processor 62 such as a microcontroller (μC) and/or a digital signal processor (DSP). Typically, the DSP processes voice signals, while the μC manages operation of the MS 60. The processor 62 is coupled to a transceiver means 64 coupled to radio transmission means, e.g., an antenna 66. A memory 68, such as an EPROM and RAM, is coupled to the processor 62 and stores data related to operation and configuration of the MS 60. Communication from the BS 50 to MS 60 takes place on a downlink channel 72, while communication from the MS 60 to BS 50 takes place on an uplink channel 74. The MS 60 also includes a user interface such as a keyboard and a screen, as well as a microphone coupled to the transmit branch or section of the transceiver 64 and a speaker coupled to the receiver section of the transceiver 64.

The transmit section of the transceiver 64 transmits signals over the uplink channel 74, which the receive branch of the transceiver 64 receives signals over the downlink channel 72. The transceiver 64 includes a selection means to selectively couple a power amplifier (PA) of the transmit section or a low noise amplifier (LNA) of the receive section to the antenna 66. Illustratively, the selection means includes a duplexer or bandpass filters tuned to the transmit and receive frequency ranges, respectively. As is well known in the art, the transceiver 64 also includes other circuits such as a down converter for converting the received radio frequency (RF) signals to intermediate frequency and/or baseband signals, and demodulator/decoder in the receive branch. By contrast, the transmit branch of the transceiver 64 includes an up converter and a modulator/encoder. Converters that convert between analog and digital formats are also typically present in the transceiver 64.

Figure 3:
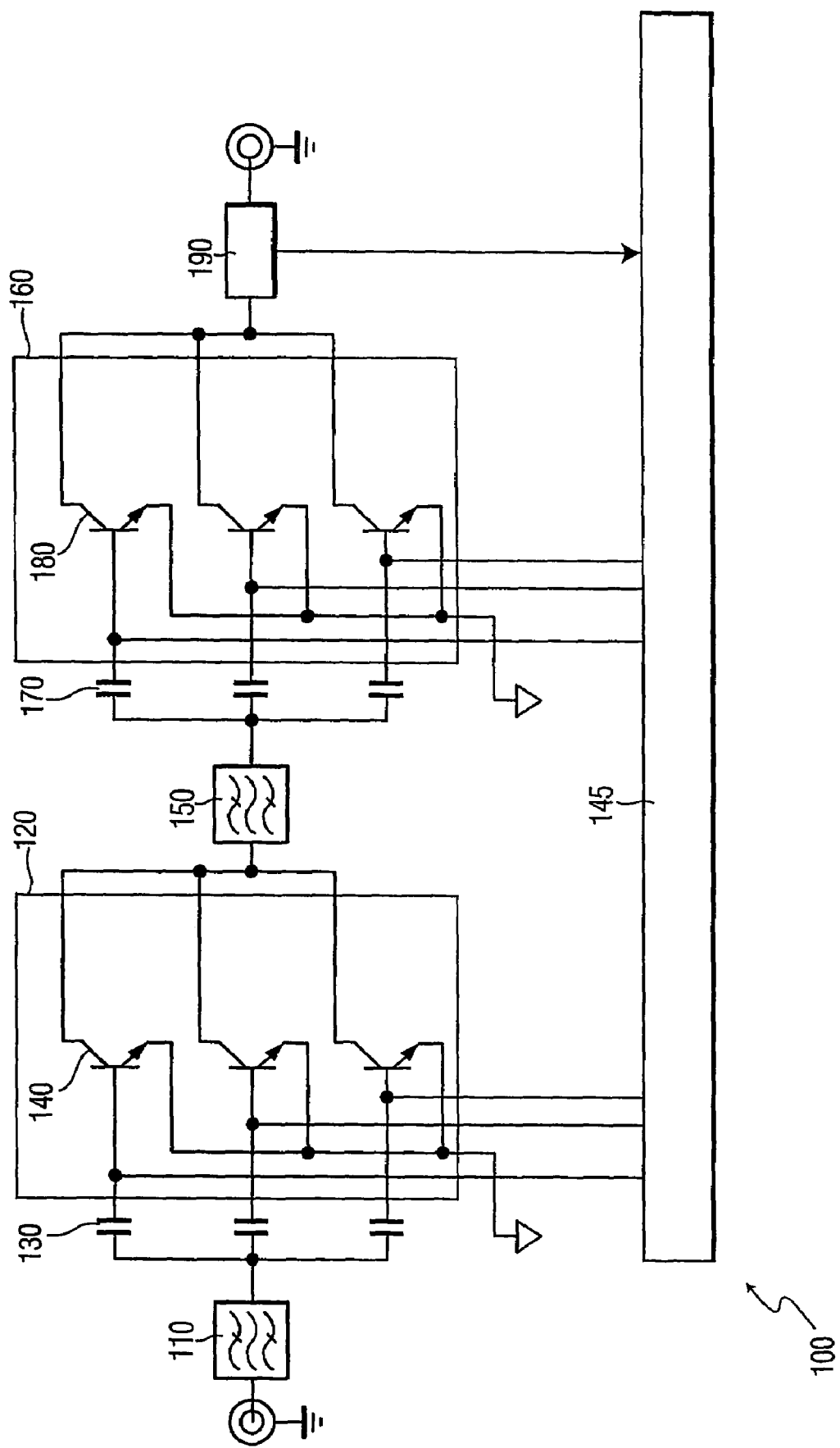
FIG. 3 shows an isolator-free amplifier circuit according to the present invention.

FIG. 3 shows an embodiment of an amplifier circuit 100 according to the present invention which is illustratively used as a power amplifier circuit to amplify RF signals in wireless communication devices. For example, the amplifier circuit 100 is part of the transceiver 64 of the MS 60 shown in FIG. 2, and more particularly, in the transmit branch of the transceiver 64. Typically, the input of the amplifier circuit is coupled to a modulator and receives modulated RF signals for amplification. The amplifier output is coupled to a load, such as the antenna 66, where the amplified RF signals are transmitted over the air on the uplink channel 74 for example.

As shown in FIG. 3, the amplifier circuit 100 comprises an input match circuit 110 for buffering the input of the amplifier circuit 100 and matching its input impedance with the output impedance of the circuit coupled thereto, such as a modulator. The output of the input match circuit 110 is coupled to a driver stage 120 through DC blocking capacitors 130. The signal to be amplified, such as a modulated signal, is provided by the input match circuit 110 to the capacitors 130, which substantially block DC components and provide a signal substantially without a DC offset to the driver stage 120.

The driver stage 120 comprises a plurality of active devices, such as transistors 140, which receive the substantially DC-free signal from the capacitors 130 for pre-amplification to a first level. Illustratively, three pre-amplification bipolar transistors, such as NPN transistors 140 are used, each having a base coupled to a respective capacitor 130. Each base is further independently coupled to a bias control circuit 145 for providing a proper DC biasing signal. This allows the bias control circuit 145 to independently and selectively control, e.g., turn on or off, each transistor 140. The emitter of each transistor 140 is coupled to ground, while the output or collector of each transistor 140 is coupled to an inter-stage match circuit 150 for buffering and impedance matching between the output of driver stage 120 and input of an output stage 160.

The pre-amplified signal from the driver stage 120 is provided to the input of the output stage 160 through the inter-stage match circuit 150, and DC blocking capacitors 170 for substantially blocking DC signals similar to the DC blocking capacitors 130.

The output stage 160 is similar to the driver stage 120 and also comprises a plurality of transistors 180 which receive the substantially DC-free signal from the capacitors 170 for amplification to the output level. Illustratively, three amplification NPN transistors 180 are used, each having a base coupled to a respective capacitor 170. Each base is further independently coupled to the bias control circuit 145 for providing the proper DC biasing signal. This allows the bias control circuit 145 to independently and selectively control, e.g., turn on or off, each transistor 180. Thus, all the control ports of the active devices, e.g., all the bases of the transistors 140, 180 are independently coupled to the bias control circuit 145 allowing it to independently and selectively control each of the transistors 140, 180, thus adjusting the amplification or gain of the driver and output stages 120, 160. The emitter of each transistor 180 is connected to ground, while the output or collector of each transistor 180 is directly or indirectly coupled to the load without any isolation therebetween. Further, the emitter area of each active device 140, 180 is selected such that optimum performance is achieved for a given load, inter-stage and source condition.

By way of example, suppose a power amplifier is to deliver 30 dBm of output power to a 50 ohm load. If the power amplifier's final stage's output has peak voltage swing of 1.4 volts for linear operation, then a loss-less impedance matching network separating load and power amplifier must have an impedance transformation ratio of 51:1.

Figure 4:
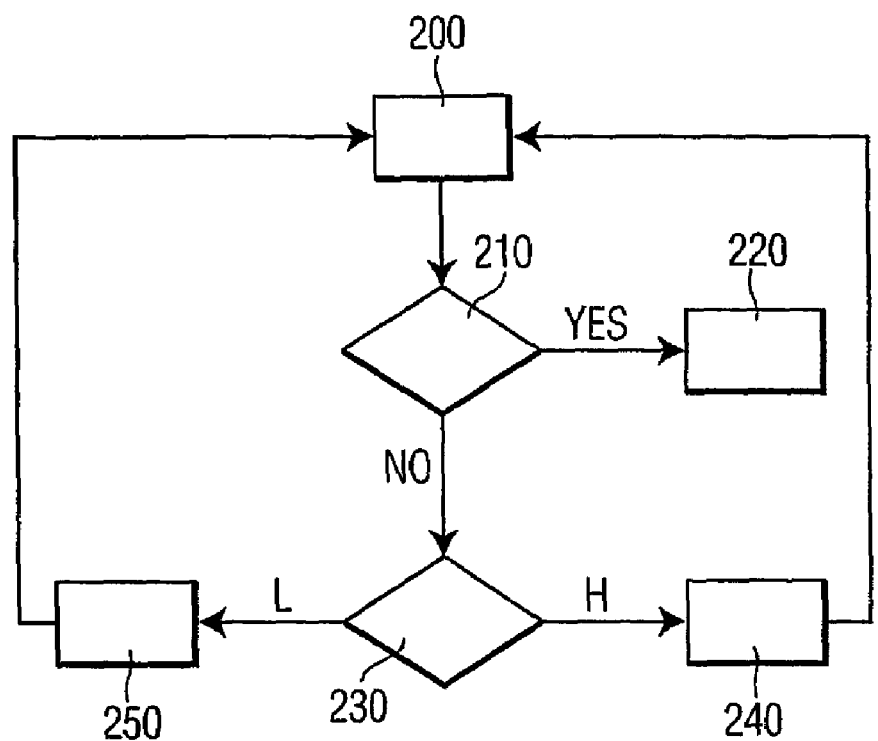
FIG. 4 shows a flow chart of a method for preserving performance, e.g., linearity, of an isolator-free amplifier circuit according to the present invention.

Consider a worst case mismatch condition over all phases of a constant VSWR. The two impedance extremes are high and low loads. In the former case, large voltage swings develop across the output of the final stage causing non-linearity in the form of clipping due to the onset of high AC impedance. In the later case, the demand for output current elevates due to the onset of low AC impedance. By monitoring the incident and reverse power levels, a measurement of the impedance condition is obtained as shown in block 200 of FIG. 4. In block 210, the impedance level or mismatch is checked and if a normal or matched level is obtained, then normal matched operation is continued in block 220. If the impedance level or mismatch is not normal as determined in block 210, then it is determined in block 230 whether the difference or ratio of the measured forward and reflected signals is high or low. If it is high, indicating a relatively high forward signal, then in block 240 less active area is switched by switching in less transistors, for example. If the determined in block 230 indicates that the difference or ratio of the measured forward and reflected signals is low, indicating a relatively low forward signal, then in block 250 more active area is switched by switching in more transistors, for example. Illustratively, the active area is switched from more to less for a low to high load impedance variation in accordance with the desired output power and linearity. Next, the impedance condition is re-measured by returning to block 200 and the operations are repeated until a matched level is obtained in block 210 and normal matched operation is continued in block 220. The monitoring and measurement of the impedance in block 200 are continuously or intermittently checked and adjustments are made, if needed, to arrive to the matched condition of block 220.

Returning to FIG. 3, a detector, such as a power detector 190, is also coupled to the output of each transistor 180 for detecting the level, e.g., the power level, of the amplified RF signal at the output of the output stage 160. The power detector 190 is in turn coupled to the bias control circuit 145. The output of the amplifier circuit 100 is coupled to an antenna without an isolator therebetween.

The power detector 190 provides the DC bias control circuit 145 a measure of the forward and reflected output power of the amplifier circuit 100. As a function of the forward and reflected power levels, the DC bias control circuit 145 independently and selectively controls each of the respective transistors 140, 180 of the driver and output stages 120, 160 to substantially maintain the optimum performance and constant linearity of the amplifier circuit 100 despite variations in the impedance of the load connected to the output of the amplifier circuit 100. In particular, the bias control circuit 145 turns on or off each active device independently by providing the proper direct current (DC) biasing at the base of each of the active devices 140, 180, thus switching in more or less active devices 140, 180 in response to the difference between the forward and reflected power level.

As is well known by one skilled in the art, the changes in the forward and reflected power levels measured by the power detector 190 are related to changes in the load impedance, e.g., the impedance of the antenna 66 shown in FIG. 2. In particular, for a load impedance substantially matched to the output impedance of the output of the amplifier circuit 100, the ratio or the difference between the forward and reflected power levels is high, while it is low for substantially mismatched impedances. U.S. Pat. No. 5,423,082, which is incorporated herein by reference in its entirety, discloses a transmitter that includes a closed loop feedback to compensate for varying antenna loads without an isolator, which is accomplished by taking the reflected output energy into account to maintain a constant overall loop gain by adjusting the gain of variable gain stages.

Bias control circuits are also well known in the art, such as the bias control circuit disclosed in U.S. Pat. Nos. 5,442,322 and 5,712,593 which are incorporated herein by reference in its entirety. In U.S. Pat. No. 5,442,322, a bias control circuit compares a bias control voltage with a value indicative of the current in an active device and provides a control signal to the control terminal of the active device to control the operating point thereof. The bias point of a power amplifier is similarly controlled in U.S. Pat. No. 5,712,593 by a control circuit in response to comparing a reference value to a filtered portion of the RF output signal. Changing the amplifier bias point limits the effect of the load impedance variation on the amplifier performance. U.S. Pat. No. 6,064,266, which is incorporated herein by reference in its entirety, is also related to limiting the effect of the load impedance variation on the amplifier performance, which is achieved by modifying the RF output signal path, instead of the DC bias, by switching in a resistor in parallel with the output impedance when a threshold detector detects variations in the load impedance above a predetermined value.

The bias control circuit 145 of the present amplifier circuit 100 may include a processor or a comparator for comparing the values of forward and reflected power levels measured by the power detector 190 with at least one threshold value. Based on the comparison, the DC bias control circuit 145 selectively and independently controls turning on or off the transistors 140, 180 of the driver and output stages as necessary, namely, as a function of the levels of the forward and reflected signals, to substantially maintain constant the linearity of the amplifier circuit 100 with load variations.

Figure 5:
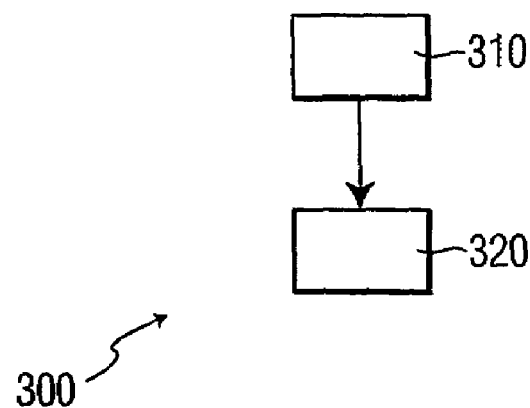
FIG. 5 shows a summarized flow chart of the method for preserving performance, e.g., linearity, of an isolator-free amplifier circuit according to the present invention.

FIG. 5 shows a flow chart 300 of a method for preserving performance of an isolator-free amplifier circuit according to the present invention. In block 310, the power detector measures the forward and reflected power levels at the output of the amplifier circuit and provides this information to the bias control circuit 145. In response to the measured forward and reflected power levels, such as their difference or ratio values, in block 320, the control circuit 145 selectively and independently turns on or off the active devices 140, 160, such as by providing proper DC biasing, to substantially maintain optimal performance and constant linearity of the amplifier circuit 100 shown in FIG. 3.

While the present invention has been described in particular detail with reference to specific exemplary embodiments thereof, it should also be appreciated that numerous modifications and changes may be made thereto without departing from the broader and intended spirit and scope of the invention as set forth in the claims that follow. The specification and drawings are accordingly to be regarded in an illustrative manner and are not intended to limit the scope of the claims which follow.

The invention claimed is:

1. An amplifier circuit comprising: a driver stage having first active devices which receive a signal for pre-amplification and output a pre-amplified signal; an output stage having second active devices which receive said pre-amplified signal for further amplification and output an amplified signal; a detector which measures levels of a forward signal and a reflected signal respectively of said amplified signal; and a control circuit which controls turning on and off of said first active devices and said second active devices as a function of the forward signal level and the reflected signal level to substantially maintain linearity of said amplifier circuit with load variations.

2. The amplifier circuit of claim 1, wherein said output stage is coupled to a load without an isolation device between said output stage and said load.

3. The amplifier circuit of claim 1, wherein said control circuit independently controls each of said first active devices and said second active devices.

4. The amplifier circuit of claim 1, wherein said control circuit independently controls each of said first active devices.

5. The amplifier circuit of claim 1, wherein said control circuit independently controls each of said second active devices.

6. The amplifier circuit of claim 1, wherein said first active devices and said second active devices are NPN transistors.

7. The amplifier circuit of claim 1, further comprising an input match circuit coupled between an input of said amplifier circuit and said driver stage for matching an input impedance of said amplifier circuit to an output impedance of a device coupled to said input.

8. The amplifier circuit of claim 7, further comprising at least one capacitor coupled between said input match circuit and said driver stage.

9. The amplifier circuit of claim 1, further comprising at least one capacitor coupled between an input of said amplifier circuit and said driver stage.

10. The amplifier circuit of claim 1, further comprising an inter-stage match circuit coupled between an output of said driver stage and an input of said output stage for matching an input impedance of said output stage to an output impedance of said driver stage.

11. The amplifier circuit of claim 10, further comprising at least one capacitor coupled between said inter-stage match circuit and said output stage.

12. The amplifier circuit of claim 10, further comprising at least one capacitor coupled between an output of said driver stage and said output stage.

13. A wireless communication device comprising the amplifier circuit of claim 1.

14. An amplifier circuit comprising: a driver stage having a first set of active devices which receive a signal for pre-amplification and output a pre-amplified signal; an output stage having a second set of active devices which receive said pre-amplified signal for further amplification and output an amplified signal; a detector which measures levels of a forward signal and a reflected signal respectively of said amplified signal; and a control circuit which independently and selectively controls switching each active device of said first set of active devices and said second set of active devices as a function of said levels of the forward signal level and the reflected signal level to substantially maintain linearity of said amplifier circuit with load variations.

15. A method for substantially maintaining linearity of an amplifier circuit with variations of a load coupled to an output of said amplifier circuit comprising: measuring levels of a forward signal and a reflected signal respectively at said output; and turning on and off first active devices of a driver stage of said amplifier circuit and second active devices of an output stage of said amplifier circuit as a function of the forward signal level and the reflected signal level.

16. The method of claim 15, wherein said turning act independently turns on and off each of said first active devices and said second active devices.

17. The method of claim 15, wherein said turning act independently turns on and off each of said first active devices.

18. The method of claim 15, wherein said turning act independently turns on and off each of said second active devices.

19. The amplifier circuit of claim 1, wherein the control circuit controls turning on and off of said first active devices and said second active devices as a function of the forward signal level and the reflected signal level by comparing the forward signal level to the reflected signal level.

20. The amplifier circuit of claim 1, wherein the control circuit controls turning on and off of said first active devices and said second active devices as a function of the forward signal level and the reflected signal level by comparing the forward signal level and the reflected signal level with at least one reference value.

* * * * *